United States Patent [19]

Neu

[11] Patent Number: 5,405,255
[45] Date of Patent: Apr. 11, 1995

[54] ENCAPSULATON MOLDING EQUIPMENT

[75] Inventor: H. Karl Neu, Furlong, Pa.

[73] Assignee: Neu Dynamics Corp., Ivyland, Pa.

[21] Appl. No.: 52,545

[22] Filed: Apr. 23, 1993

Related U.S. Application Data

[63] Continuation-in-part of Ser. No. 981,742, Nov. 24, 1992, Pat. No. 5,316,463.

[51] Int. Cl.$^6$ .................. B29C 45/02; B29C 45/14; B29C 45/34
[52] U.S. Cl. ...................... 425/116; 249/91; 249/95; 249/96; 264/272.17; 425/121; 425/125; 425/183; 425/184; 425/185; 425/190; 425/546; 425/588; 425/812
[58] Field of Search .............. 264/272.17; 249/95, 249/91, 96, 141; 425/116, 121, 812, 544, 546, 588, 192 R, 184, 186, 183, 190, DIG. 228, 125

[56] References Cited

U.S. PATENT DOCUMENTS

| | | | |
|---|---|---|---|
| 3,650,648 | 3/1972 | Lambrecht | 425/129 |
| 3,859,023 | 1/1975 | Pasch | 425/251 |
| 4,332,537 | 6/1982 | Slepcevic | 425/121 |
| 4,368,168 | 1/1983 | Slepcevic | 264/272.14 |
| 4,442,056 | 4/1984 | Slepcevic | 264/161 |
| 4,480,975 | 11/1984 | Plummer et al. | 425/116 |
| 4,599,062 | 7/1986 | Konishi | 425/116 |
| 4,620,958 | 11/1986 | Wiechard | 425/588 |
| 4,695,420 | 9/1987 | Grawey et al. | 264/265 |
| 4,697,784 | 10/1987 | Schmid | 425/588 |
| 4,779,835 | 10/1988 | Fukushima et al. | 425/116 |
| 4,828,479 | 5/1989 | Pleasant | 425/192 R |
| 4,829,670 | 5/1989 | Hilgers | 29/882 |
| 4,861,251 | 8/1989 | Moitzger | 425/116 |
| 4,944,908 | 7/1990 | Leveque et al. | 264/232 |
| 5,008,062 | 4/1991 | Anderson et al. | 264/272.15 |
| 5,049,055 | 9/1991 | Yokoyama | 425/116 |
| 5,052,907 | 10/1991 | Matumoto et al. | 425/116 |
| 5,059,373 | 10/1991 | Hirabayashi | 264/154 |
| 5,077,237 | 12/1991 | Hara | 437/214 |
| 5,082,615 | 1/1992 | Sakai | 264/510 |
| 5,108,955 | 4/1992 | Ishida et al. | 437/214 |
| 5,123,823 | 6/1992 | Banjo et al. | 425/116 |
| 5,133,921 | 7/1992 | Yokoyama | 264/272.15 |
| 5,174,942 | 12/1992 | Barnadas | 264/272.15 |
| 5,316,463 | 5/1994 | Neu | 425/116 |

FOREIGN PATENT DOCUMENTS 62-130531  6/1987  Japan ................. 264/272.17

Primary Examiner—Khanh Nguyen
Attorney, Agent, or Firm—Synnestvedt & Lechner

[57] ABSTRACT

Encapsulation molding equipment includes individual mold bases each having an elongated shallow recess which receives strip-like carriers supporting semi-conductor chips and like objects for encapsulation. Cavity inserts having various numbers of cavities of different size and dimension individual to carriers having like numbers of chips of a range of size and dimension fit over the strips with each cavity on an insert surrounding the chip to be encapsulated. Gate and vent passages are formed on the surface of the insert spaced away from the mold base member for supply of resin from a central resin receptacle. The mold is completed by an upper mold insert plate which closes the mold and effects a seal between the mold parts and provides for delivery of encapsulating resin to the cavities in the cavity inserts. Each mold base has a plurality of recesses, each of which receives a carrier strip and a cavity insert.

16 Claims, 8 Drawing Sheets

ENCAPSULATON MOLDING EQUIPMENT

RELATED APPLICATION

This application is a continuation-in-part application of U.S. Ser. No. 07/981,742, filed Nov. 24, 1992, now U.S. Pat. No. 5,316,463.

FIELD OF THE INVENTION

This invention relates to the encapsulation molding of objects mounted on a strip-type carrier substrate and while not limited thereto is particularly directed to the encapsulation molding of electrical or electronic circuit components, such as semi-conductor chips previously fabricated on the carrier strip.

BACKGROUND OF THE INVENTION

Encapsulation molding equipment of the general kind referred to is disclosed, for example, in U.S. Pat. No. 4,368,168 dated Jan. 11, 1983. As disclosed in this patent, in the process manufacturing semi-conductor chips, elongated strips, usually made of copper or other conductive metal, and commonly called lead frames are provided. The strips of conductive metal are fabricated by stamping to form support platforms for the chips and electrical leads extending from each platform in predetermined pattern to the strip boundaries or to narrow cross pieces according to the design of the particular chips to be mounted on the support platforms. As a final step in the manufacturing process, the leads are eventually severed from the cross pieces and the boundaries after the chips are formed on the platforms, encapsulated and ready for testing and shipment.

In encapsulating the chips, an extreme degree of care must be taken to avoid handling. In the case of modern semi-conductor chips, the static electricity passing through the delicate microcircuitry on account of touching the unprotected chip, as well as the transfer of contaminants from the fingers of workers, may render it nonfunctional. In order to avoid this, considerable care must be taken to eliminate physical handling. This has been accomplished in the past by relatively expensive and complicated molds which have a large number of parts which are difficult to operate and to clean following use and are subject to undue wear and damage. In addition, known molding equipment is adaptable to encapsulation molding on only one size chip requiring separate and rather complicated molds for each size chip or for each size of lead frame strip.

The molds of the invention are intended to be used in conjunction with readily available mold presses of the type manufactured, for example, by the Hull Corp. of Hatboro, Pa. U.S.A. Mold presses of the type described have relatively moveable upper and lower platen members. The upper platen member is provided with a vertically extending cylindrical passageway into which a charge of encapsulating material, such as an epoxy resin, is adapted to be placed. The resin in solid form is heated in a preheating oven prior to its deposit in the passageway so that it is already relatively soft in consistency. The resin is then placed within the cylindrical passageway where it is heated by heating elements extending around the passageway and becomes highly liquid within a relatively short period of time. A piston forces the liquified resin to flow from the bottom of the passageway outwardly through a series of runners to mold cavities for encapsulating objects as is known in the art.

SUMMARY AND OBJECTS OF THE INVENTION

The present invention involves the encapsulation of semi-conductor chips or similar objects fabricated on the surface of a carrier strip-type substrate sometimes called a lead frame strip. The objects are encapsulated within a protective body preferably formed of a resin material, such as an epoxy, there being at least one and typically from about four to about six objects on each piece of carrier strip material. The invention in preferred form contemplates a method and apparatus for the encapsulation molding of plural chips mounted on one planar surface of each strip, the chips and the leads therefore being previously formed on the strip and being displaced axially of the strip in groups of from one to about six chips. The invention is intended to accommodate strips of different width, thickness and length, as well as strips having a range of numbers of chips, as well as sizes of chips, disposed thereon and to minimize mold set time.

In carrying out the invention, one or more removable loading bar members are adapted to be interfitted into recesses in the support surface of a support platform mounted on a platen of the mold press. Each loading bar member has an upper planar surface for support of any one of a group of chip carrying strips having different numbers or sizes of chips or strips which optionally may be of a range of lengths, thicknesses and widths. The invention further contemplates the provision of cover plates termed cavity inserts which have spaced apart cavities extending therethrough, there being one cavity insert reserved for each of the separate strips of the group of strips. The cavities within a cavity insert are equal in number to chips on the corresponding strip and are dimensioned so that they accept the chips to be encapsulated on that particular strip and receive a charge of encapsulating resin sufficient to encapsulate the chip within each cavity. An important aspect of the invention is the provision of a series of cavity inserts in which the walls of the cavities of a particular insert correspond in thickness to the height of the objects on a particular strip. Support means independent of the mold bars maintains the upper surface of all cavity inserts of the series coplanar with the surface of the support platform. Further in accordance with the invention, gate passages formed in the cavity inserts lead to each individual cavity for the particular strip. The gate passages are formed solely in the cavity inserts and are preferably formed on the surface of the cavity insert away from the removable loading bar.

The invention further provides locating pins which locate the strips on a surface of a removable mold member and maintain the relative position of the mold base member, the strips and the cavity insert independent of the dimensions of the particular strip within the group of strips which the mold is intended to receive.

The invention further contemplates the use of knockout pins for the removal of solidified resin from the mold runner structure when the mold press is opened and a gate runner construction which promotes break off of the resin within the runners from the encapsulated parts as the resin is removed from the runners in a manner which leaves substantially no flashing on the encapsulated object. Still further, the knockout means includes push pins which operate in sequence with the knockout pins to push out the removable loading bar from its supporting recess once the resin within the runners has been knocked-out and separated from the encapsulated parts.

In combination with the above, the invention provides means for vertical adjustment of the loading bar relative to the cavity inserts thereby accommodating substrates of a range of thicknesses. Preferably, the loading bars are yieldably mounted so that a uniform sealing pressure can be established between the loading bar, the cavity insert and the upper mold plate.

Advantages and objects of the invention are the provision of a mold structure comprising removable bars common to any one of a series of semi-conductor device carriers of a range of dimensions and having different numbers and/or sizes of semi-conductor devices carried thereon in combination with cavity inserts individual to each one of a group of carrier strips.

A further object of the invention is a provision of molding apparatus in which the member exposed to the greatest degree of wear and likelihood of damage, namely the mold cavity insert, is of relatively simple construction and can be readily replaced at low cost when worn without the need to replace other elements of the mold structure.

Still another object of the invention is the provision of a mold construction which is simple to clean following use and minimizes down time during the encapsulation molding of parts.

Another object of the invention is the provision of a mold construction which minimizes set-up time when changing the mold for the encapsulation of one size of objects to another.

A further object of the invention is the provision of knockout means for facilitating the removal of resin within the resin delivery runner system following encapsulation molding and the provides for removal of the mold from its support structure thereby facilitating production.

A still further object of the invention is the provision of a centering system for locating the chip carrying strips in position within the mold irrespective of differences in the number or size of the chips or the dimensions of the chip carrier strips.

Another objective of the invention is the provision of a strip locating system within the mold which allows for axial expansion of the elongated strips of strip material.

A still further object of the invention is the provision of a gate structure within the mold cavity insert which restricts the delivery of resin to the number of objects to be encapsulated thereby eliminating waste of resin.

Other objects and advantages of the invention will become apparent from the following detailed description of the preferred embodiment of the invention.

DETAILED DESCRIPTION OF THE PREFERRED EMBODIMENT OF THE INVENTION

Figure 1:
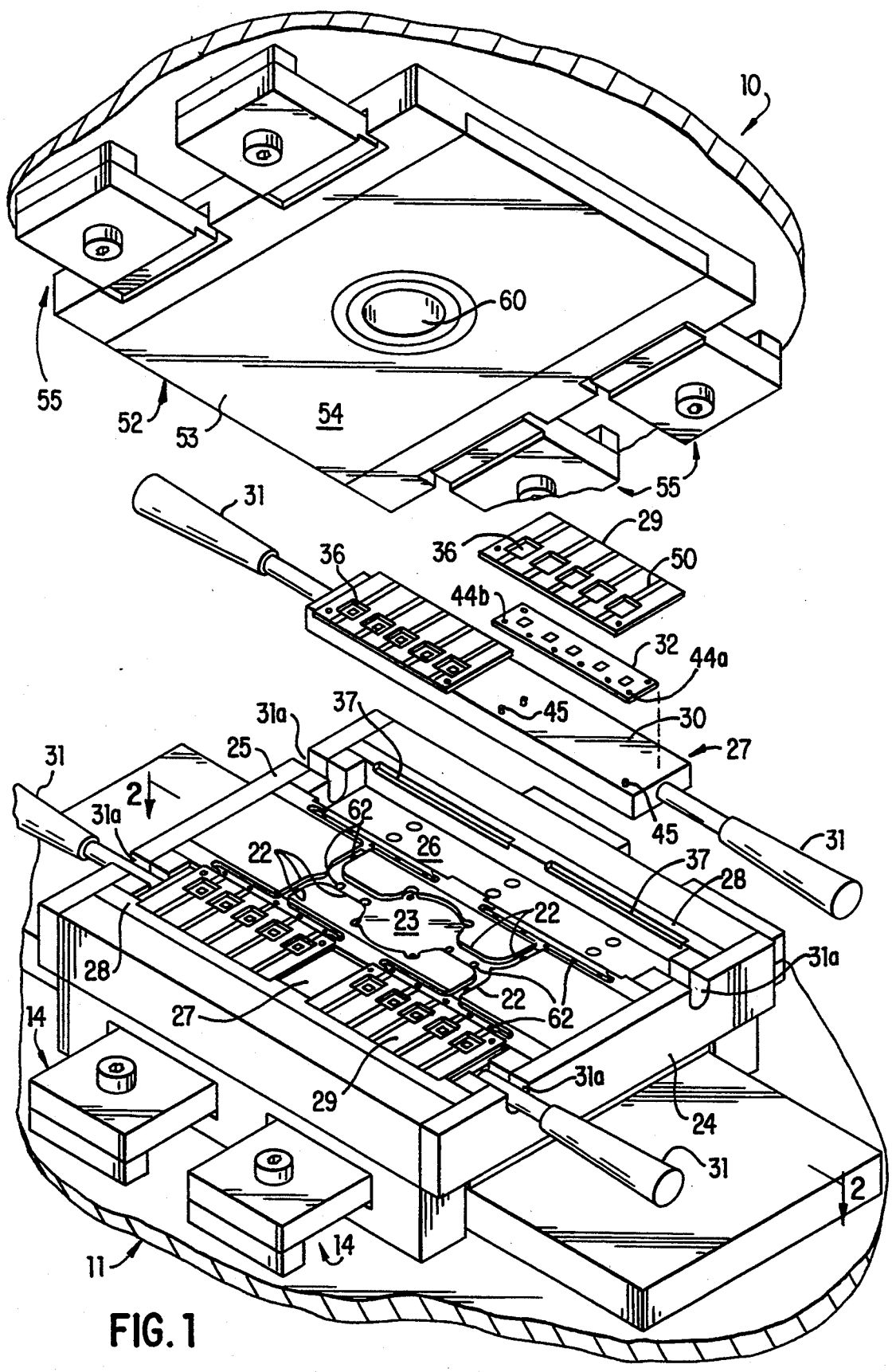
FIG. 1 is an exploded perspective view schematically representing molds formed in accordance with the present invention.
Figure 2:
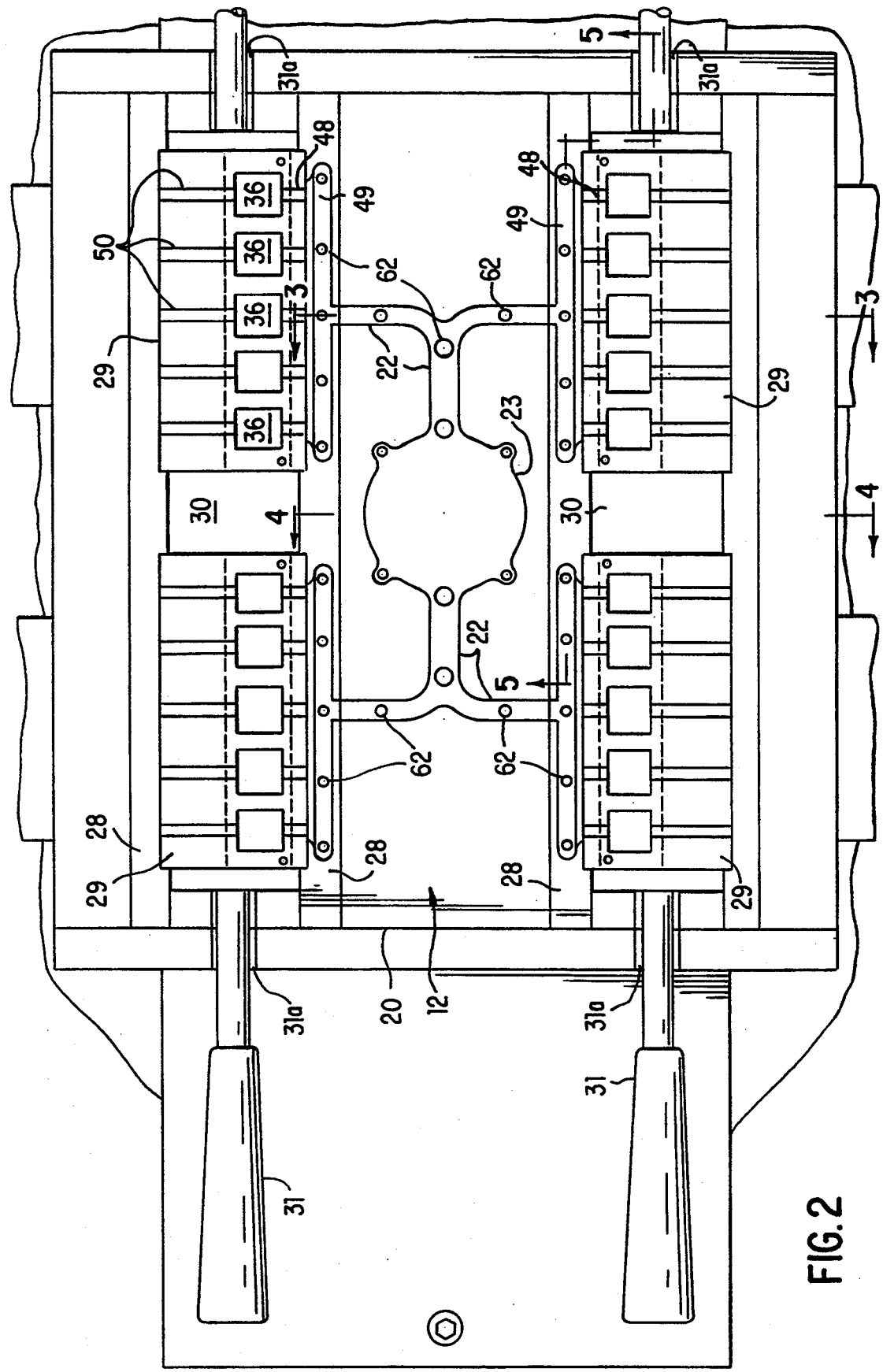
FIG. 2 is a plan view of the mold structure of FIG. 1 mounted on the lower platen member of a mold press.
Figure 3:
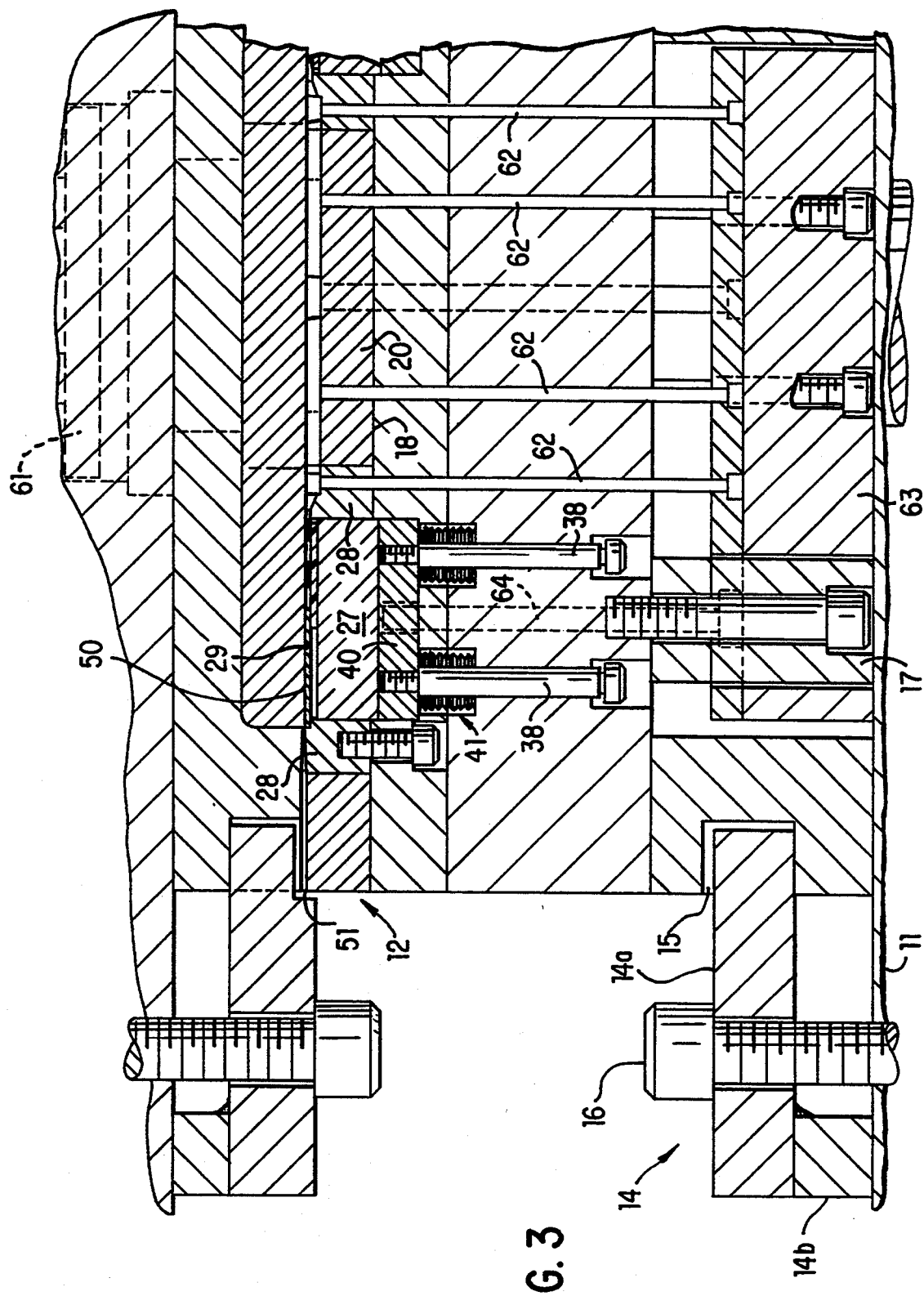
FIG. 3 is a sectional view taken on line 3—3 of FIG. 2.
Figure 4:
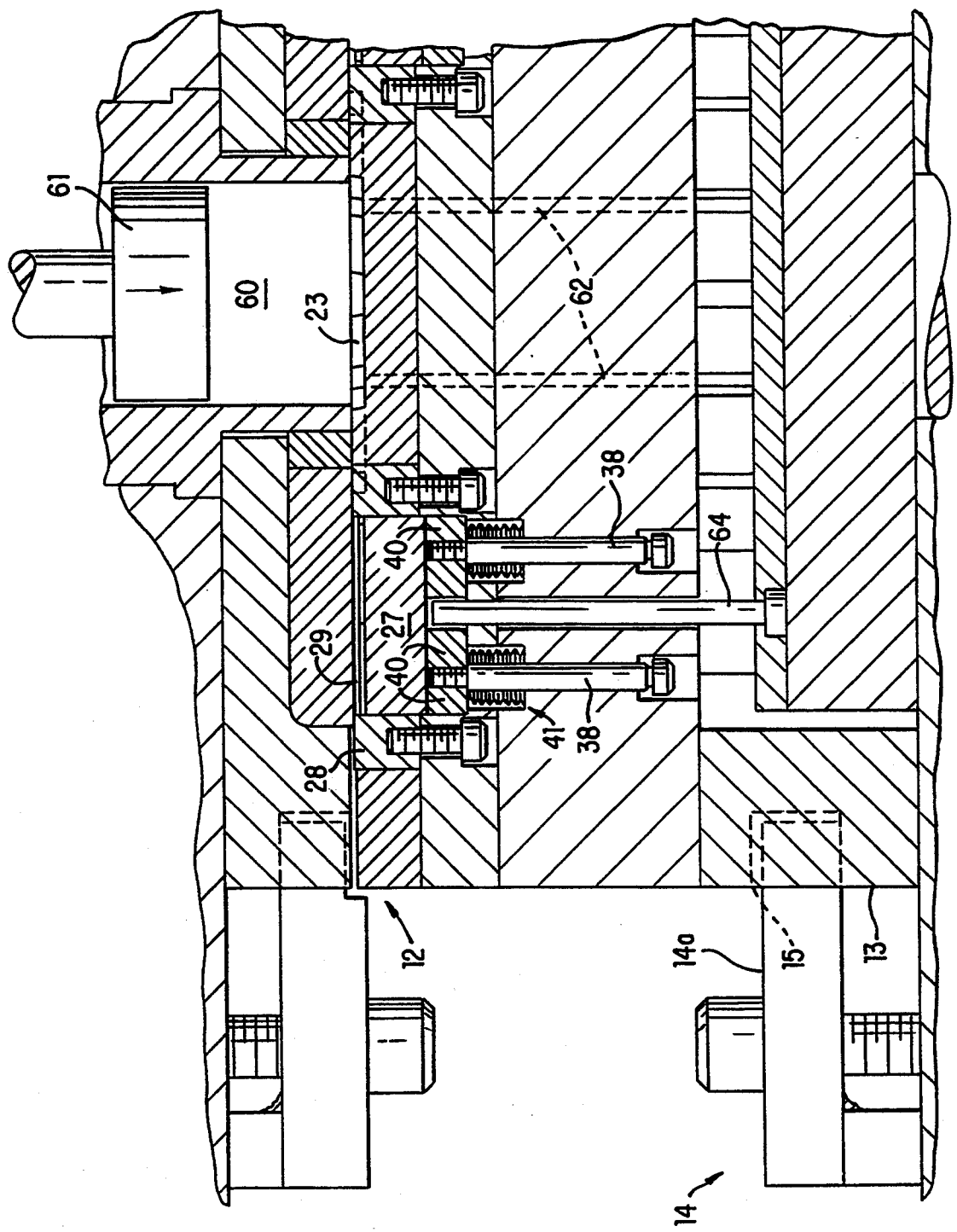
FIG. 4 is a sectional view taken on line 4—4 of FIG. 2.
Figure 5:
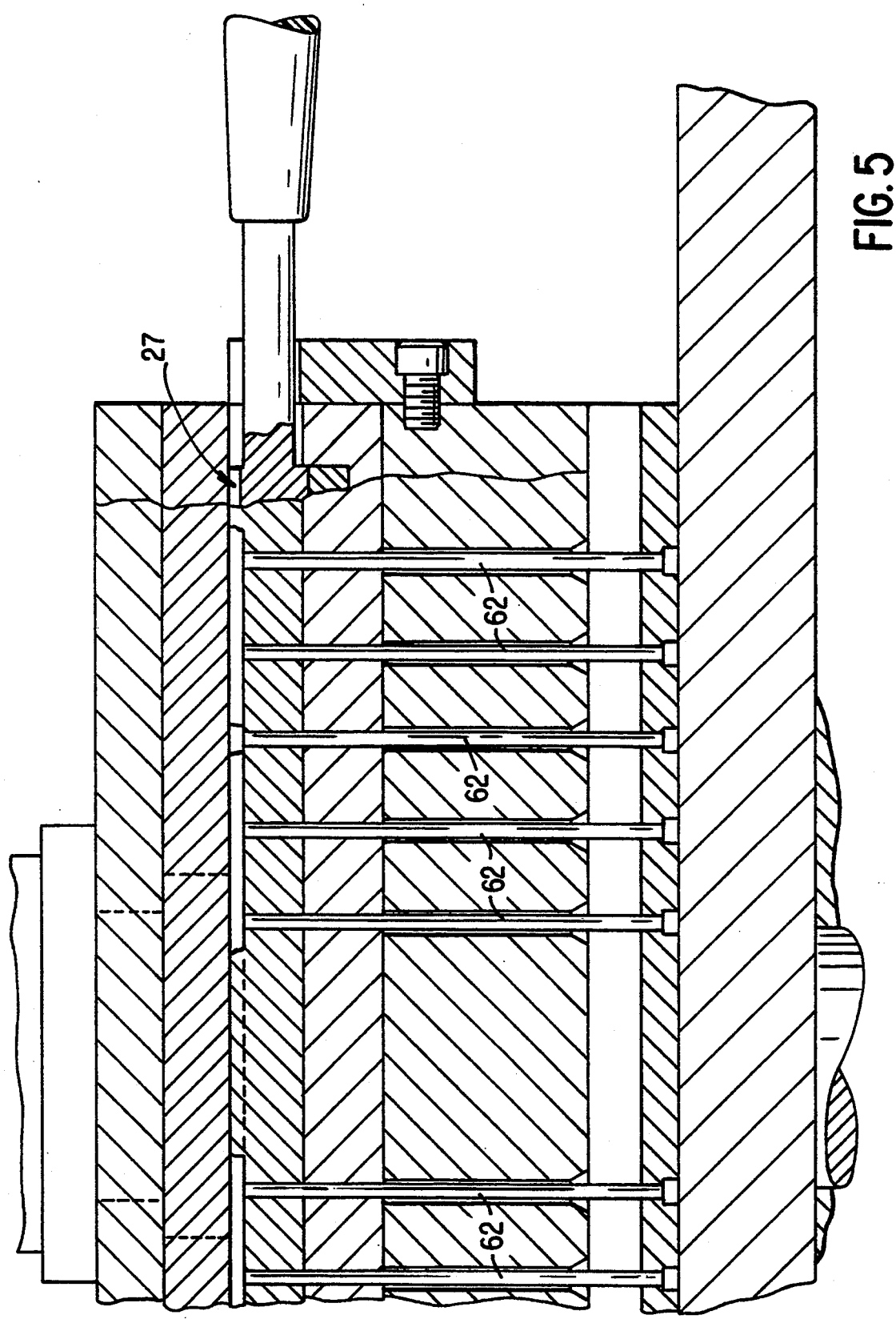
FIG. 5 is a sectional view taken on line 5—5 of FIG. 2.

Referring first to FIGS. 1-4, the molding apparatus of the present invention is mounted in a mold press comprising an upper platen member 10 and a lower platen member 11, both of which are mounted for relative vertical movement by means, not shown, between an open position and the position illustrated in FIGS. 3 and 4 wherein the mold parts supported on the lower platen member 11 are clamped and sealed together pursuant to a molding operation as is known in the art. The mold press is of conventional construction and is generally of a type supplied by the Hull Corp., more fully identified above.

In preferred form, as is best seen in FIGS. 3 and 4, the mold comprises an elevated mold support platform or plate 12 supported by elongated risers 13 which are clamped to the platen 11 by means of L shaped brackets 14. Brackets 14 have horizontally extending arms 14a which fit within spaced recesses 15 formed within the outer surface of risers 13 and bear against the platen on feet 14b. One or more machine bolts 16 directly bolt each bracket 14 to the lower platen 11 and clamp mold support platform 12 tightly in position. Support pillars 17 bolted to the underside of the platform may be provided as required to eliminate flexure when the parts of the mold are pressed together.

As best shown in FIGS. 2 and 3, mold support platform 12 has a central recessed portion 18 in the center of which an elongated center block 20 is mounted. As will be explained in more detail hereinafter, the upper surface of center block 20 provides a means for the delivery of liquified encapsulating resin through a series of branching runner passages generally indicated at 22 and which extend from a central recessed resin receptacle 23, as is best seen in FIGS. 1 and 2.

Figure 6:
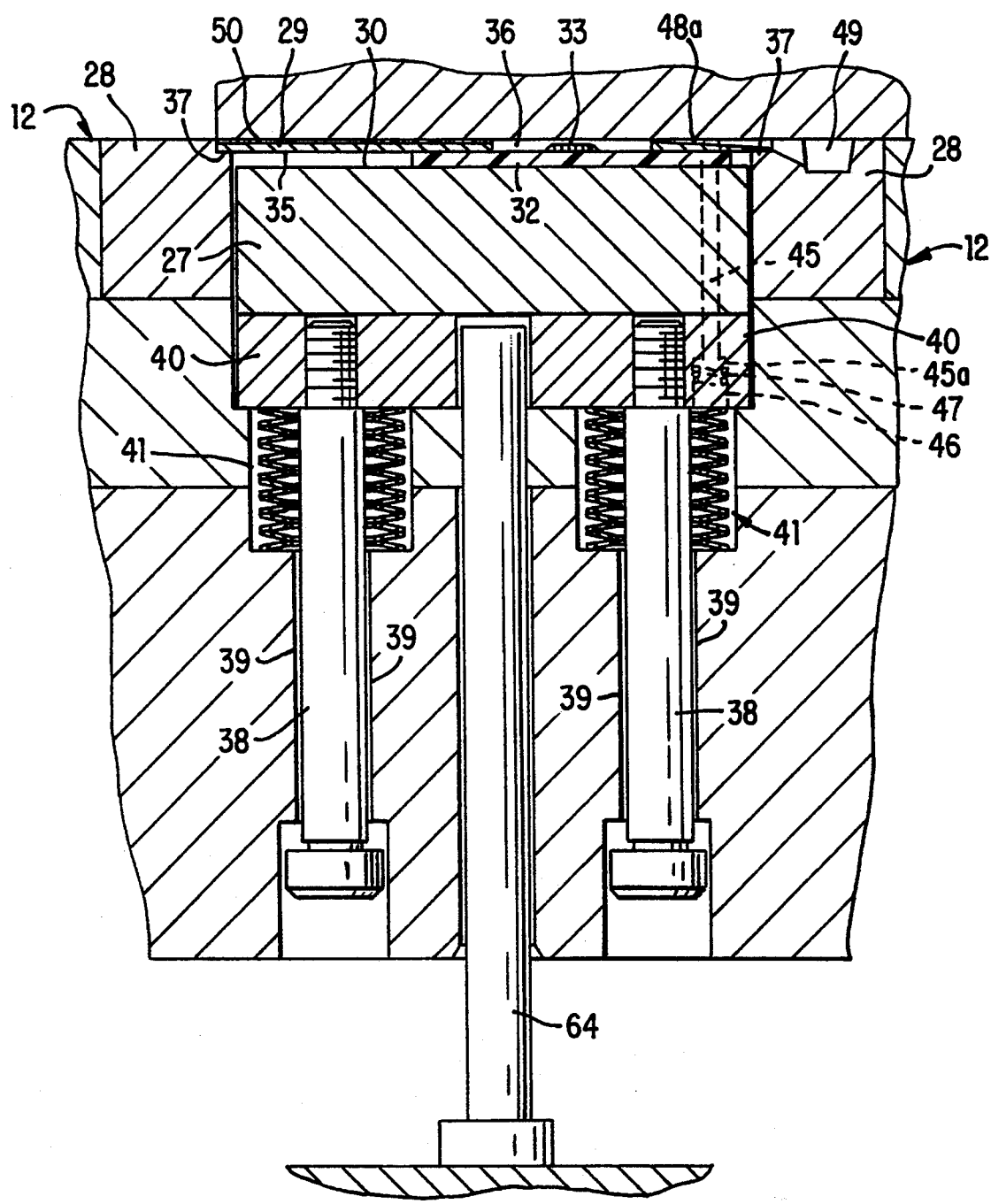
FIG. 6 is a fragmental view in cross-section of a mold of the present invention.

Also secured to the sides of platform 12 are side frame members 24 and 25 (FIG. 1). The center block, the side frame members and the raised end edges of the support platform define a pair of elongated mold support recesses 26 having vertical side walls. As is shown in FIGS. 3, 4 and 6, the sides of the recesses 26 are preferably defined by separate, removable side members 28 bolted to suitable supports underlying the platform 12.

The support recesses 26 receive removable elongated rectangular loading bars 27 which are intended to support the carrier strips on which the devices to be encapsulated are placed and covers termed cavity inserts 29 which have plural cavities 30 which are positioned to enclose the devices to be encapsulated and a charge of encapsulating resin.

Two loading bars 27 are illustrated in FIG. 1. Each loading bar 27 has an upwardly facing planar surface 30 for support of one or more carrier strips, as explained below. The loading bars further are preferably provided with handles 31 which extend from the ends of the base members and fit within notches 31a in the side frame members 24 and 25 to facilitate transportation, placement of a loading bar within the mold and its removal at the conclusion of a molding operation.

Figure 10:
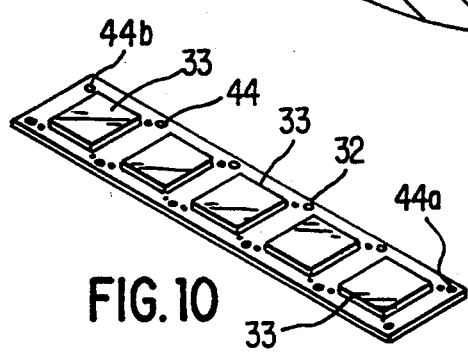
FIG. 10 is a view of a chip carrier strip showing chips encapsulated using equipment of the present invention.

As stated above, the elongated carrier strips 32 carrying a plurality of objects to be encapsulated, such as semi-conductor chips. The chips are prefabricated on the strip surfaces and have leads extending therefrom as required. One such strip with chips 33 already encapsulated is illustrated in FIG. 10. Although chips fabricated on conventional lead frame strips stamped from a conductive material, such as copper, may be encapsulated using the equipment and method of the invention, the strips are preferably formed of a plastic material and may have any number of chips, usually from about one to six, formed on the upper surface thereof in a predetermined spaced relationship.

The invention thus contemplates the provision of molding equipment intended for the encapsulation of plural objects, such as the semi-conductor chips of FIG. 10 of predetermined different sizes and especially of differing vertical dimension, as well as differences in number and spacial relationship on the strips. A particular feature of the invention involves the encapsulation of chips or other objects of a range of thicknesses using one of a group of cavity inserts each having cavities of a size individual to a particular size and spacing of the objects to be encapsulated. When change is required for encapsulating a different size or number of chips, the only mold part to be changed is the cavity insert. In addition, the invention is intended to accommodate strips that differ in length, width and strips of a range of thicknesses.

Figure 7:
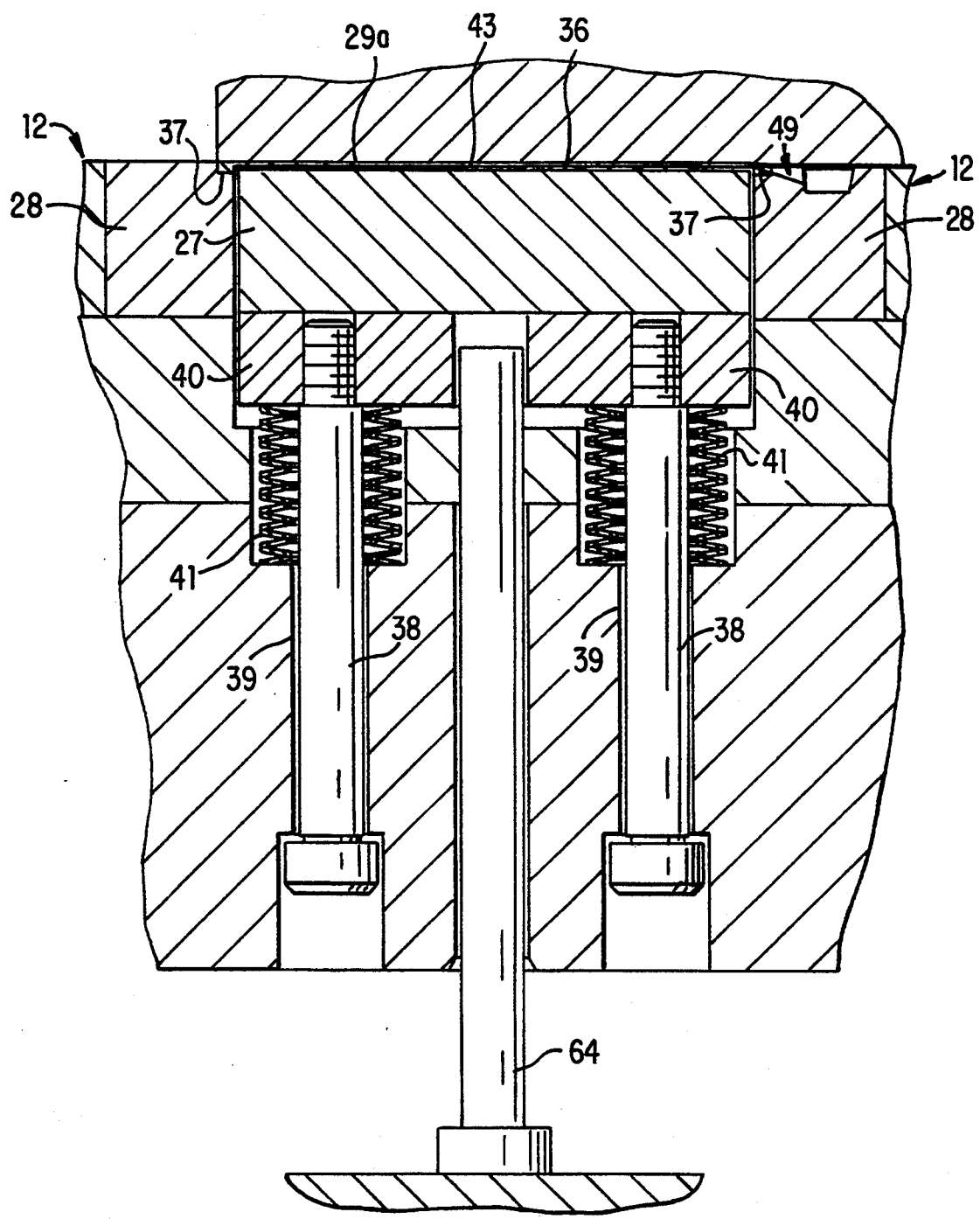
FIG. 7 is a fragmental view of a mold illustrating the use of a second form of cavity insert.
Figure 9:
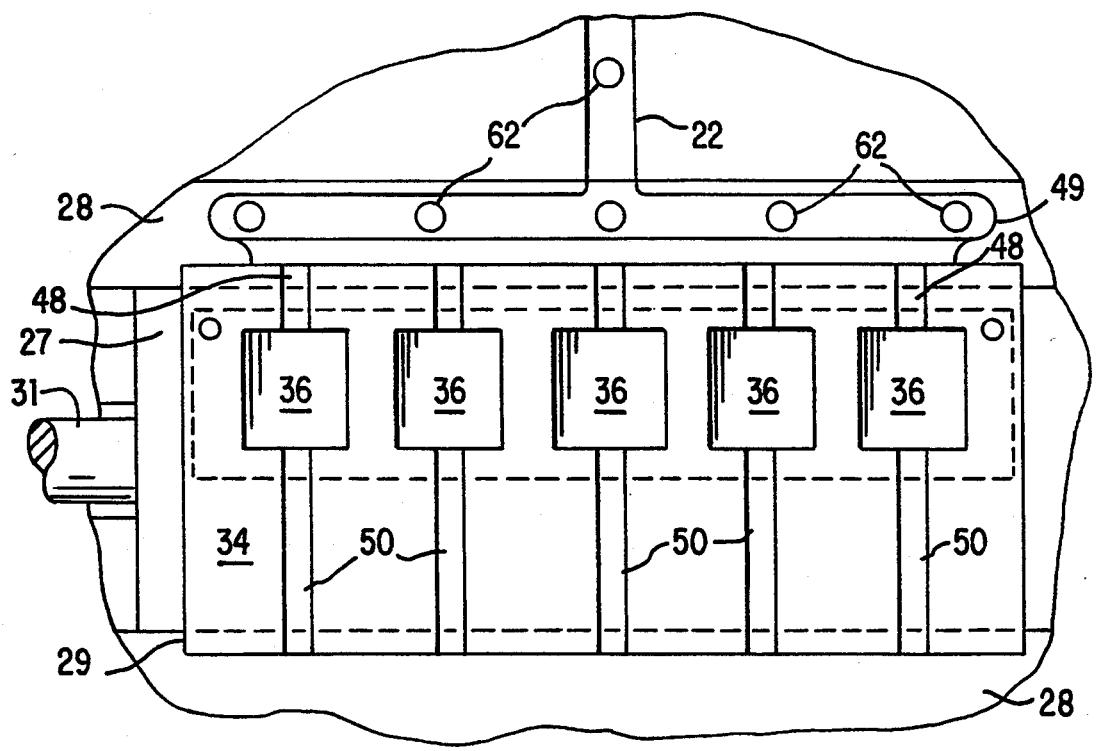
FIG. 9 is a partial plan view of a cavity insert of the type illustrated in FIG. 2.

Two cavity inserts 29 and 29a for accommodating substrates having chips of two different thicknesses can be seen by comparing the sections illustrated in FIGS. 6 and 7. According to FIG. 6, a chip which is relatively large in height or thickness is accommodated by a relatively thick cavity insert 29. By way of example, insert 29 has a thickness of about 0.046 inches which experience has indicated is about as large as is likely to be required for the encapsulation of the larger size of modern chips. In the practice of the invention, insert 29 has an upper planar surface 34 and a lower planar surface 35 and a plurality of cavities 36 (see FIG. 9). FIG. 7 is similar to FIG. 6 with the exception of the provision of a different form of cavity insert 28a used for encapsulation of thinner devices on a thinner carrier strip. As illustrated, the cavity insert 29a has edge portions of equal thickness to the edge portions of cavity insert 29a so that the upper planar surface of the insert is coplanar with the lower mold surface surrounding the insert. As distinguished from insert 29, insert 29a has a relatively thin portion 43 which accepts a chip which is at the low end of the range of thicknesses of chips expected to be encapsulated.

Although two different cavity inserts are illustrated, it is to be understood that others may be utilized and are considered to be within the scope of the invention. Considerable variation in thickness of the various inserts may be provided either thicker or thinner than the inserts shown in FIGS. 6 and 7.

Means provided for support of the cavity inserts independent of the loading bars preferably comprise steps 37 formed in the upper planar surface of the lower mold plate 12 along the side edges of the recesses 26. In FIG. 6, the side edges of the inserts are supported on the steps 37. The upper surface of each insert is coplanar with the surface of mold plate 12 when the cavity insert is positioned on the steps 37.

As seen in FIGS. 3 and 6, sufficient space is provided underneath the cavity insert in which the carrier strip for the devices to be encapsulated is located. In preferred form as shown in FIGS. 3, 6 and 7, means are provided for vertical adjustment of the loading bar so that differences in the thickness of particular substrates can be accommodated. Although other means may be employed, the adjustable means preferably comprises elongated shoulder bolts 38 which are fitted into bores 39 and threaded into threaded openings in pressure insert plates 40 which support the loading bars 27. As shown, the upper end of each bore 39 is counterbored to accept a set of disc springs 41. By a variation in the number of disc springs 41, the height of the loading bar can be yieldably adjusted, thus assuring that a seal is established between the upper surface of the substrate and the lower surface of the cavity insert when the mold is assembled.

FIG. 7 also illustrates the adjusted position of the loading bar which is required when the chips are mounted on a relatively thin substrate. In FIG. 7, two additional disc springs 41 raise the loading bar 27 to provide a space between the loading bar upper surface and the lower surface of the cavity plate of 0.012 inches.

Means are provided for accurately locating the carrier strips on the upper surface of each loading bars 27 and the cavity inserts in appropriate position on the strips. In the preferred embodiment advantage is taken of the fact that, for other purposes, the strips 32 are already provided with a series of indexing openings 44. The openings 44 are preformed on the strips in predetermined, fixed positions for use in cooperation with indexing equipment for indexing the strips during other chip fabricating procedures. Although other notches or holes could be formed for the purpose, two such indexing openings, denominated 44a and 44b in FIG. 10, are used as positioning openings for locating the strips in fixed position on the loading bars. As can be seen in broken lines in FIG. 6, pins 45 extend upwardly from the surface of each loading bar recess 30 and fit within the openings 44a and 44b for the purpose of positioning each strip 32. Preferably, one of the pins should have a diameter substantially equal to the diameter of the corresponding opening so as to firmly locate one end of the strip axially of the cavity, whereas the other should be slightly smaller in an amount, sufficient to allow for the calculated axial expansion of the strip which occurs due to the heat of the molding process.

In preferred form, provision is made for retraction of the pins so that their tips are moved downwardly into the openings in the cavity inserts 28 when the mold is closed. A preferred pin 45 is illustrated in FIG. 6. According to FIG. 6, the pins have an enlarged head 45a which fit within counterbores 46. A spring 47 urges each pin upwardly through the upper surface of the loading bar and an opening in the cavity.

In order to deliver liquified resin to the cavities within the inserts, cavity inserts 29 and 29a further have gate passages 48 which are preferably on that surface side of an insert which are opposite to the loading bar. The gate passages communicate with flood gates 49 which in turn communicate with the runners 22, thus providing a flow passage for the liquid resin extending directly from the common resin receptacle 23 into the cavities 36. A comparison of the gate passage configuration for the cavity inserts 28 and 28a can best be seen by reference to FIGS. 6 and 8. Each such gate passage has in common an upwardly sloping portion 48a which joins the upwardly sloping bottom of flood gate 49.

Shallow vent grooves 50 (FIGS. 3 and 6) extending from each cavity 36 are also preferably formed in the upper surface of the cavity inserts and allow for the venting of gas and any excess resin from the cavities through a clearance space 51.

The relatively shallow flat gate section 48a promotes fracture of the solidified resin so that it can be easily separated from the encapsulated part once the mold is opened.

Referring to FIGS. 1 and 3, the upper mold structure comprises upper mold member 52 mounted on upper platen 10 and has a recess which receives an upper mold plate 53 having a lower planar surface 54. Upper mold member 52 is clamped in position on the upper platen 10 by any suitable means, such as brackets 55, which may be similar in construction to brackets 14.

Centrally located within the upper platen member 10 and extending through the upper mold member 52 and the upper mold insert plate 53 is a cylindrical resin receptacle 60. The resin receptacle 60 is in axial alignment with the central receptacle 23 which is located centrally of the lower plate 20.

As indicated above, upper platen 10 and lower platen 11 are adapted for relative vertical movement toward and away from one and another for opening and closure of the mold. When the platens are moved together, upper mold surface 54 presses against the uppermost surface of each of the cavity inserts 29, 29a effecting a seal with the cavity inserts, as can be seen in FIG. 3. In this position, the resin receptacle portion 60 also is in registry with and forms a seal around the perimeter of the resin receptacle portion 23. As is conventional in the art, encapsulating resin in pellet form is inserted into the upper end of the resin receptacle 60 in preheated and relatively soft form when the mold parts are clamped together. Heater means surrounding the receptacle within the upper platen rapidly reduce the resin to a highly liquid form within receptacle portion 23. As can be seen in FIGS. 3 and 4, a hydraulic operated piston 61, schematically represented, forces the resin outwardly through runner passages, through the cull and the gate passages so as to fill the mold cavities within each cavity insert.

Means are provided for facilitating the removal of the loading bars from the mold and the solidified resin from the runners and from the cull and the gate passages once the resin has solidified. As a preferred means to accomplish this, a series of resin knockout pins 62 are supported on a base plate 63 immediately beneath passages 22 and receptacle portion 23. Plate 63 rests on the platen 11 and is raised relatively to the platen 11 when the upper and lower platens move to the open position. The position of the knockout pins within the various runners can be seen in FIGS. 2 and 9.

Also mounted on platen 11 are push pins 64 (FIGS. 3, 4, 6 and 7) for knocking out the loading bars. The push pins are located immediately beneath the loading bars. The pins 62 and 64 are of a length relatively to one another such that when the mold opens, the knockout pins 62 first strike the solidified resin within the runners, lifting it up causing the resin to fracture within the narrow section of the gate immediately next to the encapsulated part. As the push pins 64 rise an additional amount, they then strike the bottom of the loading bars 27 pushing them out of their locating recesses. Thereafter as the mold parts move further apart, clearance is provided so that the operator can manually lift each loading bar from its support recess 26 by grasping the handles 31. Thereafter, the solidified resin which has been upset by the knockout pins can be manually removed and the mold is readied substantially immediately for reuse.

Figure 8:
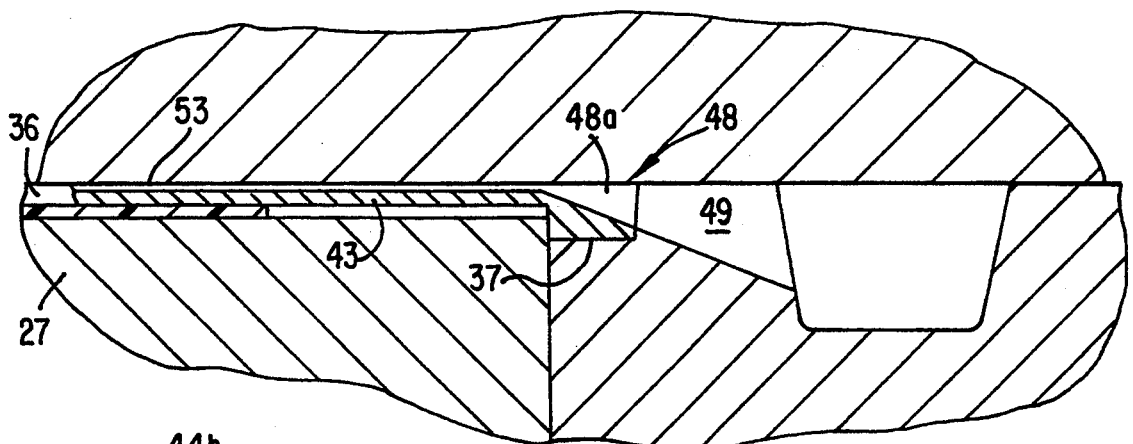
FIG. 8 is a detail view on an enlarged scale of a portion of the mold structure shown in FIG. 7.

In operation of the molding equipment of the present invention, the loading bars 27 are loaded with carrier strips 32 each carrying a predetermined number of chips to be encapsulated. In loading the strips 32, the index openings 44 are fitted over pins 45, thereby positioning each strip on the loading bar upper surface. A cavity insert 29 or 29a having cavities corresponding to the number of chips on the particular strip 32 and otherwise dimensioned so that the cavities correspond to those on the strip is placed on each loading bar 27. As can be seen in FIGS. 1 and 8, the locating pins 45 extend through the pair of openings in the cavity inserts so that each base member, strip and cavity insert are maintained in the intended relationship.

With the mold press open, a predetermined number of disc springs 41 are placed beneath pressure inserts 40 so that the loading bar is adjusted to the required height. The loading bars are next fitted into recesses 26, the side surfaces of the cavity inserts are supported on the steps 37. The mold is then closed, and preheated resin is then supplied to the upper opening in resin receptacle 45 and the piston 46 is actuated to force liquified resin from receptacle 23 through runners 22 into cavities 36.

Upon curing of the resin, the mold press opens, causing pins 62 to remove waste solidified resin from the runners 22 and the receptacle 23 and effecting a fracture of the resin within the shallow gate. Immediately thereafter, the knockout pins 64 raise the loading bars from the recesses 26.

I claim:

1. An encapsulation mold for encapsulation of discrete objects on the upper surface portion of a flat carrier strip, the mold being adapted for use with a mold press having a base platen for support of the mold and an upper platen, said base platen and said upper platen being relatively movable between an open and closed position, said encapsulation mold comprising:
   a carrier strip support bar, said support bar having a substantially planar upper surface portion for support of a carrier strip having spaced apart objects to be encapsulated projecting upwardly therefrom;
   a first mold member having an upper planar surface, runner passages in said upper planar surface of said first mold member;
   means for positioning said carrier strip support bar adjacent to said upper planar surface of said first mold member;
   a series of interchangeable cavity inserts for said support bar, each said cavity insert having an upper planar surface and a lower sealing surface and mold cavities extending from said upper planar surface to said lower sealing surface, the cavity inserts of the series being disposed in predetermined position for registry with the objects to be encapsulated on a carrier strip individual to one of the cavity inserts of the series, each said lower sealing surface maintaining a seal with the upper surface portion of a flat carrier strip when the carrier strip is supported on said carrier strip support bar;
   means for support of any one of the cavity inserts of the series independently of the support bar, including step means disposed along said support recess, said step means being vertically displaced below said upper planar surface by a preselected vertical distance;

said cavity inserts of said series having edge portions of predetermined thickness equal to the preselected vertical distance and interfacing with the step means for maintaining the upper planar surface of the cavity inserts of the series coplanar with the upper planar surface of the first mold member; and yieldable means for vertical adjustable support of said carrier strip support bar, the upper platen being in interengagement with the upper planar surface of the first mold member and of the said any one of said cavity inserts when the base platen and said upper platen are in the closed position with the yieldable means yieldably urging the support bar upwardly against the carrier strip and the carrier strip upwardly against the cavity insert sealing surface.

2. An encapsulation mold for the encapsulation of discrete objects on a flat carrier strip, the mold being adapted for use with a mold press having a base platen for support of the mold and an upper platen, said mold comprising:

a support bar for the carrier strip, said support bar having a planar upper surface for support of the carrier strip having objects to be encapsulated projecting upwardly from its upper surface;

a first mold member having an upper planar surface, said first mold member being supported on said base platen, a substantially rectangular positioning recess adjacent to said first mold member, said positioning recess being dimensioned to receive said support bar;

a cavity insert for said support bar, said cavity insert having an upper planar surface and mold cavities corresponding in number to the objects on a carrier strip on said support bar and further having a lower sealing surface surrounding each mold cavity and adapted to interface with the carrier strip, each said cavity being dimensioned to contain one of said objects and a charge of resin in an amount sufficient to encapsulate said object;

support means underlying the edges of said cavity insert for supporting the insert independently of said support bar, said support means being located relatively to the upper planar surface of said first mold member for maintaining the upper planar surface of the cavity insert coplanar with the upper planar surface of said first mold member; and adjustable means for vertical adjustment of said support bar relatively to said cavity insert in accordance with differences in thickness of said carrier strips.

3. An encapsulating mold according to claim 2, wherein said cavity insert is one of a series of cavity inserts, the inserts of the series each having a central region surrounding the cavities and extending lengthwise thereof between projecting side edges, the thickness dimensions of the central regions being a variable dimension in accordance with variations in thickness of the objects to be encapsulation molded.

4. Apparatus according to claim 3, wherein said cavity insert support means comprises a pair of steps each formed in the upper planar surface of said mold plate means along one of said side edges of said recess for support of the edge portions of each of said cavity inserts, said step and said edge portions being of equal depth whereby the upper surface of an insert is coplanar with the upper surface of said mold plate means.

5. Equipment according to claim 2, wherein said means for vertical adjustment of said carrier strip support bar comprises yieldable means.

6. Equipment according to claim 5, wherein said yieldable means comprises stacked disc springs underlying said carrier strip support bar.

7. An encapsulating mold according to claim 6, wherein the cavity insert is one of a series of inserts each having side edge portions of constant thickness and each having a central region surrounding the cavities of the insert, the thickness of the wall portion in the central region of each insert within the series being of a preselected different depth to sufficiently accommodate differences in thickness of objects to be encapsulated.

8. Apparatus according to claim 7, wherein said cavity insert support means comprises a step formed in the upper planar surface of said mold plate means along the edges of said recess for support of the edge portions of each of said cavity inserts, said step and said edge portions being of equal depth whereby the upper surface of an insert is coplanar with the upper surface of said mold plate means.

9. Equipment according to claim 8, further including gate passages formed within the upper planar surface of each said cavity insert for delivery of encapsulating material to the cavities.

10. Equipment according to claim 9, wherein said gate passages are formed in the cavity inserts on the surface opposite to the surface adjacent to said positioning recess.

11. Equipment according to claim 10, further including vent passage means for venting said mold cavities, said vent passage means being formed in the said upper surface of each said cavity insert.

12. Equipment according to claim 11, further including a carrier strip locating device including at least one locating pin in said loading bar, said pin being positioned to pass through an opening disposed in predetermined position within said carrier strip.

13. An encapsulating mold for use with a mold press having base and upper platen members movable toward and away from one another;

a removable loading bar supported on said base platen, said loading bar having an upper support surface for support of a carrier strip for objects to be encapsulated, said carrier strip and said objects each having a different discrete thickness within a range of thicknesses;

mold plate means on said base platen, said mold means having an upper planar surface and a substantially rectangular loading bar positioning recess for supporting and positioning said loading bar;

a cavity insert for said loading bar, said cavity insert having an upper planar surface and a plurality of mold cavities extending therethrough, said mold cavities each being dimensioned to receive on of said objects and a charge of encapsulating resin in an amount sufficient to encapsulate the object within the cavity;

support means underlying the edges of said cavity insert for providing support of the cavity insert independently of said loading bar, said support means maintaining the upper planar surface of the cavity insert coplanar with the upper planar surface of the mold plate means; and adjusting means for vertically adjusting the loading bar relatively to the cavity insert for accommodating variations in the thickness of a carrier strip supported within said recess.

14. A mold according to claim 13, wherein said adjusting means further includes means for maintaining a seal between the upper surface of the carrier strip and the lower surface of the cavity insert.

15. A mold according to claim 14, wherein said means for maintaining a seal comprises resilient means for resiliently pressing said loading bar and said carrier strip against said cavity insert.

16. A mold according to claim 15, wherein said support means comprises an elongated step extended along the periphery of said loading bar positioning recess, the edge portions of said cavity insert overlying the step having a thickness equal to the depth of said step, whereby the upper planar surface of the cavity insert is maintained coplanar with the upper planar surface of said mold plate means.

* * * * *

UNITED STATES PATENT AND TRADEMARK OFFICE
CERTIFICATE OF CORRECTION

PATENT NO. : 5,405,255

DATED : April 11, 1995

INVENTOR(S) : Neu

It is certified that error appears in the above-identified patent and that said Letters Patent is hereby corrected as shown below:

Column 3, line 37, "the" should be --then--

Column 10, line 1, "step" should be --steps--

Column 10, line 61, "on" should be --one--

Signed and Sealed this

Twenty-second Day of August, 1995

Attest:

BRUCE LEHMAN

*Attesting Officer*    *Commissioner of Patents and Trademarks*